United States Patent [19]

Okamoto

[11] Patent Number: 4,910,578
[45] Date of Patent: Mar. 20, 1990

[54] SEMICONDUCTOR DEVICE HAVING A METAL ELECTRODE INTERCONNECTION FILM WITH TWO LAYERS OF SILICIDE

[75] Inventor: Tatsuo Okamoto, Itami, Japan

[73] Assignee: Mitsubishi Denki Kabushiki Kaisha, Tokyo, Japan

[21] Appl. No.: 159,401

[22] Filed: Feb. 11, 1988

Related U.S. Application Data

[63] Continuation of Ser. No. 877,422, Jun. 23, 1986, abandoned.

[30] Foreign Application Priority Data

Jun. 25, 1985 [JP] Japan .................. 60-141021

[51] Int. Cl.$^4$ ............... H01L 29/46; H01L 29/54
[52] U.S. Cl. ............................. 357/71; 357/67
[58] Field of Search .......................... 357/71, 67

[56] References Cited

U.S. PATENT DOCUMENTS

| | | | |
|---|---|---|---|
| 3,537,174 | 11/1970 | May | 357/715 |
| 3,607,240 | 9/1971 | Kunert | 357/675 |
| 4,361,599 | 11/1982 | Wourm | 357/715 |
| 4,458,410 | 7/1984 | Sugaki et al. | 357/715 |
| 4,566,026 | 1/1986 | Lee et al. | 357/71 |

FOREIGN PATENT DOCUMENTS

| | | | |
|---|---|---|---|
| 58-63165 | 4/1983 | Japan | 357/715 |
| 60-14475 | 1/1985 | Japan | 357/67 |

OTHER PUBLICATIONS

*Thin Solid Films*, 96 (1982) 327-345 Elec. & Optics, Ting et al. "The Use of Titanium-Based ... Technology".
Wittmer, J. Vac. Sci. Technol. A2 (2), Apr.-Jun. 1984, pp. 273-278, "Barrier Layers:Princ. and Appl. in Microelec."
IBM TDB vol. 25 No. 4 Sep. 1982 "Enhanced Polycide Structures" Campbell & Sullivan.
J. Vac. Sci. Tech. 17(4) Jul./Aug. 1980.
"Refract. Sil. for Int. Circ." Muraska pp. 775-791.r i
Sequeda, Jour. of Metals Nov. 1985. "The Role of Thin Film ... Fabrication" pp. 54-59.

Primary Examiner—Andrew J. James
Assistant Examiner—Jerome Jackson, Jr.
Attorney, Agent, or Firm—Lowe, Price, LeBlanc, Becker & Shur

[57] ABSTRACT

A semiconductor device comprises a silicon substrate (1) formed with impurity diffusion layers (5, 9) in a region defined by insulating films (2a, 2b) for separating elements and an aluminum alloy film (11) for electrode interconnection having a contact hole portion 7 whose bottom is electrically in contact with the impurity diffusion layers (5, 9). A titanium silicide (TiSi$_2$) film (4) is deposited on the surfaces of the impurity diffusion layers (5, 9) to reduce sheet resistivity thereof as well as reduce contact resistance between the same and the aluminum alloy film (11). A molybdenum silicide (MoSi$_2$) film (8) is further formed thereon to prevent the TiSi$_2$ film (4) from corrosion in removal of an oxide film through etching, while a titanium nitride (TiN) film (10) is formed thereon to prevent thermal reaction of the aluminum alloy film (11) and the MoSi$_2$ film (8).

10 Claims, 6 Drawing Sheets

SEMICONDUCTOR DEVICE HAVING A METAL ELECTRODE INTERCONNECTION FILM WITH TWO LAYERS OF SILICIDE

This application is a continuation of application Ser. No. 877,422, filed June 23, 1986 now abandoned.

BACKGROUND OF THE INVENTION

1. Field of the Invention

The present invention relates to a semiconductor device, and more particularly, it relates to a semiconductor device having a metal electrode interconnection film which is applied to a large-scale semiconductor integrated circuit (LSI).

2. Description of the Prior Art

FIGS. 1 and 2 are sectional views showing an example of a conventional semiconductor device which is applied to an LSI.

With reference to FIG. 1, description is now made on the structure of the conventional semiconductor device. Referring to FIG. 1, insulating films 1a and 2b for separating respective elements are formed on a silicon substrate 1 and an impurity diffusion layer 5 is formed in a region defined by the insulating films 2a and 2b. Thereafter another impurity diffusion layer 9 is formed in this region through an ion implantation method or a thermal diffusion method. Interlayer insulating films 6a and 6b are formed on the insulating films 2a and 2b and the impurity diffusion layer 5, and an aluminum alloy film 11 is formed thereon to have a contact hole portion 7 whose bottom is in contact with the surface of the impurity diffusion layer 5.

Description is now made on the function of the conventional semiconductor device as shown in FIG. 1. The silicon substrate 1 and the impurity diffusion layer 5 are in P-N junction with each other to form a path for electric signals, which path corresponds to source-/drain layers of a MOS element. The impurity diffusion layer 5 is electrically in contact with the aluminum alloy film 11 serving as an upper electric signal path at the bottom of the contact hole portion 7. The other impurity diffusion layer 9 is adapted to improve the P-N junction in peak inverse voltage, particularly in surge voltage, and is formed by introducing N-type impurities into the P-type semiconductor silicon substrate 1 through ion implantation or thermal diffusion. Even if the contact hole portion 7 is deviatingly formed in a region lapping over the insulating layer 2a or 2b, in which region no impurity diffusion layer 5 is formed to provide P-N junction, the other impurity diffusion layer 9 is self-alignedly formed through the contact hole portion 7 to provide P-N junction.

However, the conventional semiconductor device of the aforementioned structure has various disadvantages as follows:

(1) In recent years, elements are implemented with higher density of integration, whereby semiconductor devices must be vertically reduced in size in addition to having a fine structure in the horizontal direction. In other words, it is important to form impurity diffusion layers reduced in depth in order to retain/improve characteristics of the elements. In the conventional semiconductor device as shown in FIG. 1, however, the impurity diffusion layers are increased in sheet resistivity by a reduction in depth.

(2) The impurity diffusion layer 5 of the conventional semiconductor device as shown in FIG. 1 is electrically in contact with the aluminum alloy film 11, and in such case, contact resistance is essentially higher than that between metal layers.

(2) In heat treatment after formation of the aluminum alloy film 11, counter diffusion takes place between aluminum (Al) in the aluminum alloy film 11 and silicon (Si) in the impurity diffusion layer 5 to cause the so-called "punch-through" of "spike" phenomenon breaking the original P-N junction. In order to prevent such a phenomenon, a supersaturated concentration of Si is generally added in the aluminum alloy film 11. However, such added Si is deposited on the impurity diffusion layers 5 and 9 in portions close to the bottom of the contact hole portion 7 in a cooling step after the said heat treatment, as shown by 12a and 12b in FIG. 2. The effective contact opening area between the aluminum alloy film 11 and the impurity diffusion layer 5 is decreased by the deposited Si portions 12a and 12b, leading to an increase in contact resistance. Further, the deposited Si portions 12a and 12b including Al are of P types to form P-N junction with the N-type impurity diffusion layers 5 and 9, whereby the contact resistance is further increased when currents flow in the reverse bias direction.

(4) Even if Si is added in the aluminum alloy film 11 as hereinabove described, the said "punch-through" or "spike" phenomenon is caused to break the original P-N junction when Si is unevenly distributed or the heat treatment is performed at a high temperature for a long time.

The aforementioned various disadvantages are particularly serious these days with a decrease in the diameter of contact holes and a reduction in the depth of the impurity diffusion layers for highly integrating the elements of fine structure. "The Use of Titanium-Based Contact Barrier Layers in Silicon Technology" by C. Y. Ting and M. Wittmer in Thin Solid Films, 96 (1982) pp. 327–344 disclosed a technique of providing a contact barrier layer of only molybdenum silicide ($MoSi_2$) or only titanium silicide ($TiSi_2$) between an aluminum alloy layer and a silicon substrate in order to improve the aforementioned points, whereas such technique is still insufficient in various points such as chemical resistance.

SUMMARY OF THE INVENTION

Briefly stated, provided according to the present invention is a semiconductor device which comprises a semiconductor silicon substrate formed with an electrode region, a metal electrode interconnection film having a contact hole portion selectively formed to be positioned on the electrode region and a metal silicide film formed at least between the said electrode region and the bottom of the said contact hole portion to electrically couple the electrode region with the metal electrode interconnection film.

In another aspect of the present invention, the electrode region is an impurity diffusion layer or a polycrystal silicon film.

In still another aspect of the present invention, the metal silicide film is a single-layer ternary silicide film.

In a further aspect of the present invention, the said metal silicide film is a multilayer film consisting of two or three types of metal silicide films.

In a further aspect of the present invention, a diffusion barrier is further formed on the said metal silicide film.

Accordingly, it is a principal object of the present invention to provide a semiconductor device which can form a thin electrode region in a semiconductor silicon substrate, thereby to improve the density of integration.

It is another object of the present invention to provide a semiconductor device with improved contact resistance between an electrode region in a semiconductor silicon substrate and a metal electrode interconnection film.

It is still another object of the present invention to provide a semiconductor device which is excellent in heat resistance and chemical resistance.

A principal advantage of the present invention is that an electrode region in a semiconductor silicon substrate such as an impurity diffusion layer or a polycrystal silicon film can be improved in sheet resistivity.

Another advantage of the present invention is that the electrode region is not corroded in removal of an oxide film through etching.

Still another advantage of the present invention is that metal such as Al contained in the metal electrode interconnection film can be prevented from diffusion in heat treatment of the semiconductor device, thereby to prevent breakage of P-N junction in the electrode region.

These and other objects, features, aspects and advantages of the present invention will become more apparent from the following detailed description of the present invention when taken in conjunction with the accompanying drawings.

DESCRIPTION OF THE PREFERRED EMBODIMENT

Description is now roughly made on a method of manufacturing a semiconductor device having a metal electrode interconnection film according to an embodiment of the present invention with reference to the accompanying drawings.

FIGS. 3A to 3I are sectional views showing steps of manufacturing the semiconductor device according to the embodiment of the present invention.

Figure 1:
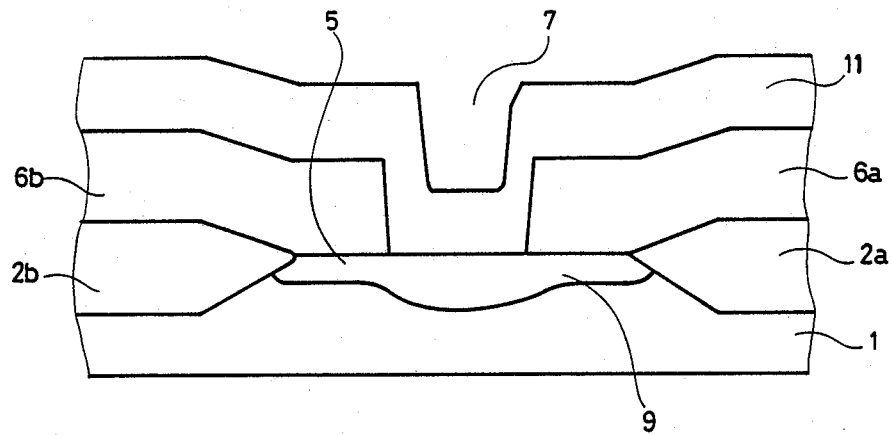
FIG. 1 is a sectional view showing a conventional semiconductor device.
Figure 2:
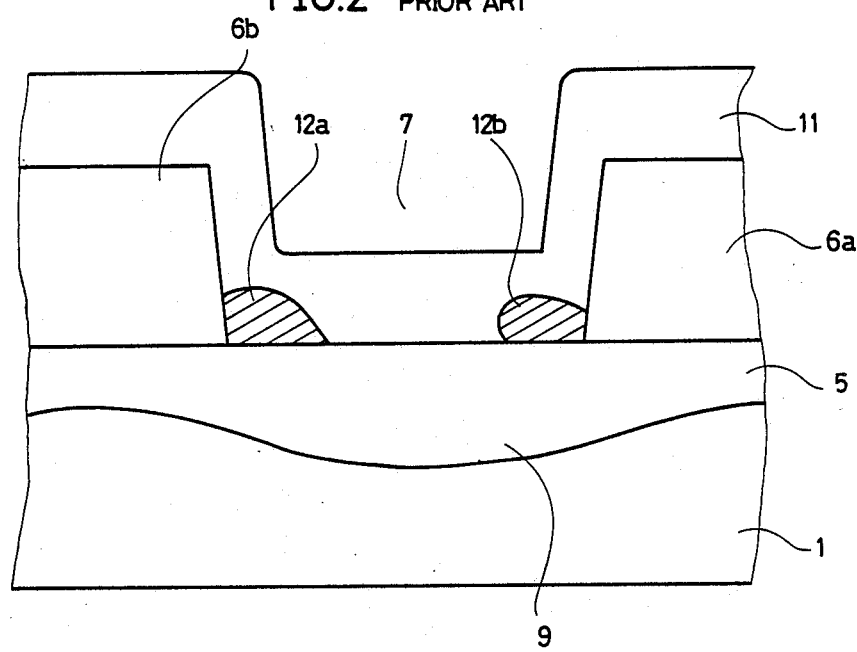
FIG. 2 is a sectional view showing a state in which silicon is deposited at the bottom of a contact hole portion in the semiconductor device as shown in FIG. 1.
Figure 3A:
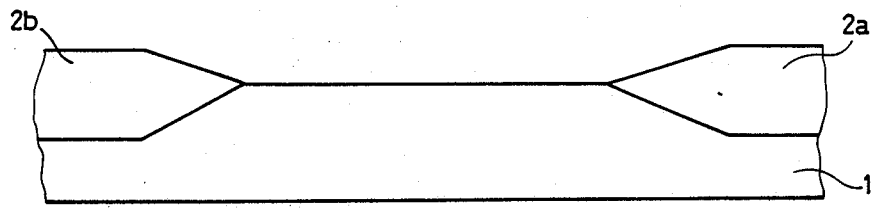
FIGS. 3A to 3I are sectional views showing steps of manufacturing a semiconductor device according to an embodiment of the present invention.

Referring to FIG. 3A, relatively thick insulating films 2a and 2b are formed on the main surface of a silicon substrate 1 for separating respective elements, similarly to the conventional semiconductor device as shown in FIG. 1.

Figure 3B:
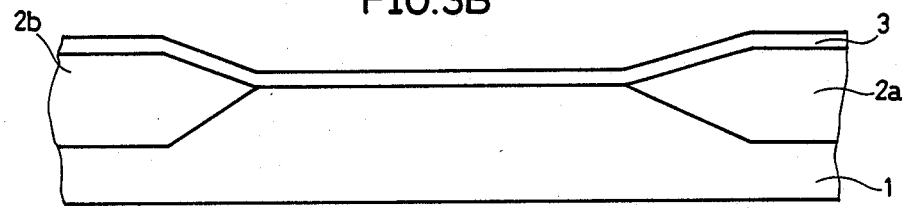

Referring to FIG. 3B, a film 3 of titanium (Ti) is formed on the entire surfaces of the silicon substrate 1 and the insulating films 2a and 2b through, e.g., a sputtering process.

Figure 3C:
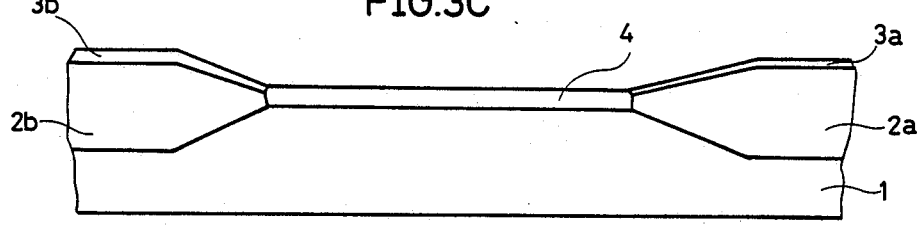

Referring to FIG. 3C, heat treatment is performed to cause silicide reaction between Si in the silicon substrate 1 and Ti in the Ti film 3, thereby to self-alignedly form a film 4 of titanium silicide ($TiSi_2$) on the main surface of the silicon substrate 1. Therefore, separated Ti films 3a and 3b are left on the insulating films 2a and 2b respectively.

Figure 3D:
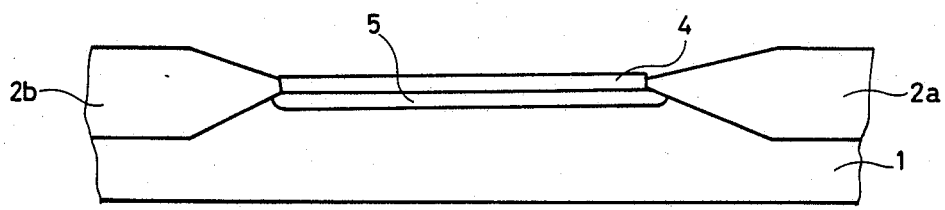

Referring to FIG. 3D, an impurity diffusion layer 5 is formed in a region of the silicon substrate 1 covered by the $TiSi_2$ film 4 through ion implantation and heat treatment, so that the impurity diffusion layer 5 and the silicon substrate 1 form a P-N junction. The Ti films 3a and 3b left on the insulating films 2a and 2b in the step of FIG. 3C are selectively removed by etching.

Figure 3E:
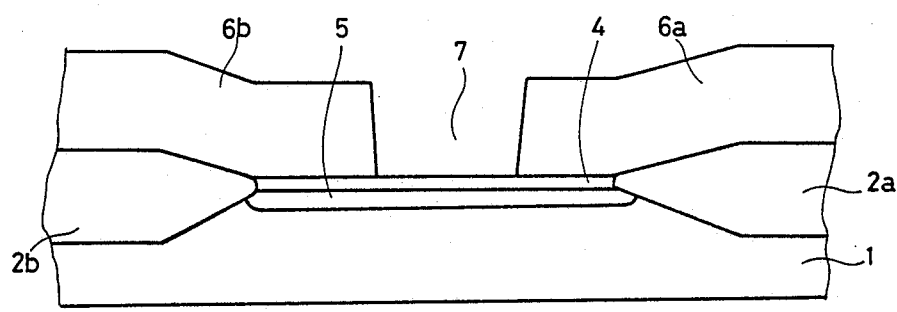

Referring to FIG. 3E, interlayer insulating films 6a and 6b are formed on the surfaces of the $TiSi_2$ film 4 and the insulating films 2a and 2b through, e.g., a chemical vapor deposition (CVD) method, while a contact hole 7 is selectively formed on a region of the $TiSi_2$ film 4 through a photolithography process and an etching process.

Figure 3F:
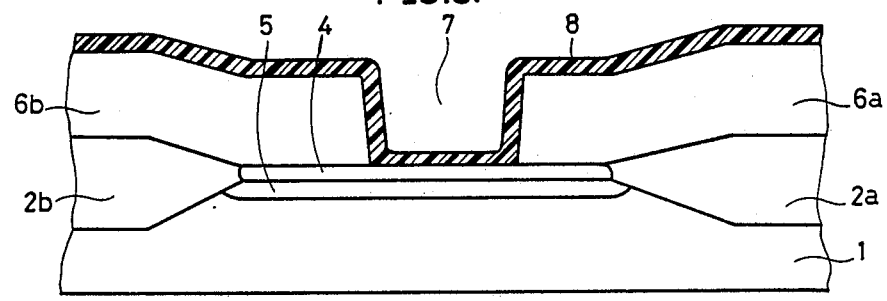

Referring to FIG. 3F, a film 8 of, e.g., molybdenum silicide ($MoSi_2$) is formed entirely over the surfaces of the interlayer insulating films 6a and 6b and the interior of the contact hole 7 through a sputtering method or the like.

Figure 3G:
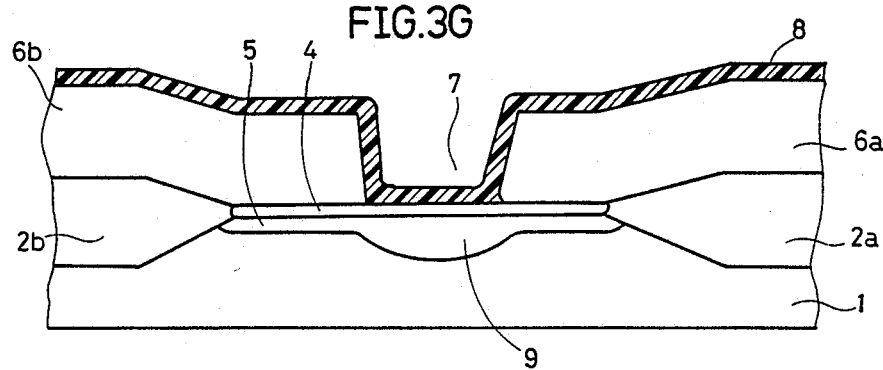

Referring to FIG. 3G, another impurity diffusion layer 9 is self-alignedly formed through the contact hole 7 similarly to the conventional semiconductor device as shown in FIG. 1.

Figure 3H:
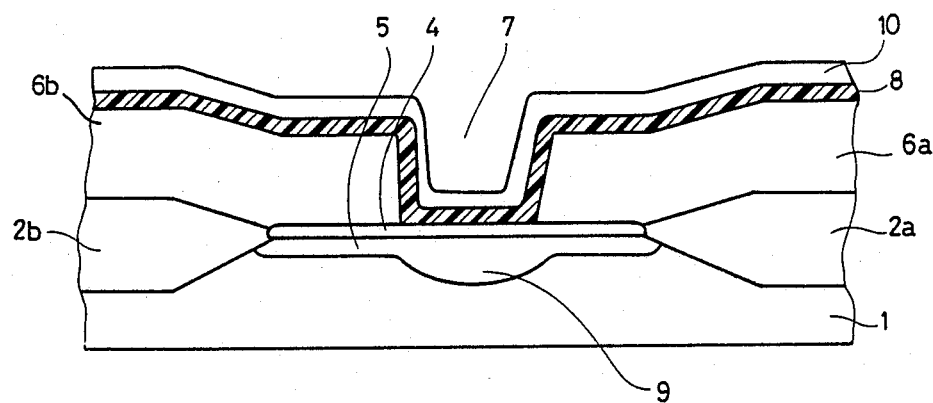

Referring to FIG. 3H, a film 10 of, e.g., titanium nitride (TiN) is formed by a sputtering method or the like over the entire surface of the $MoSi_2$ film 8.

Figure 3I:
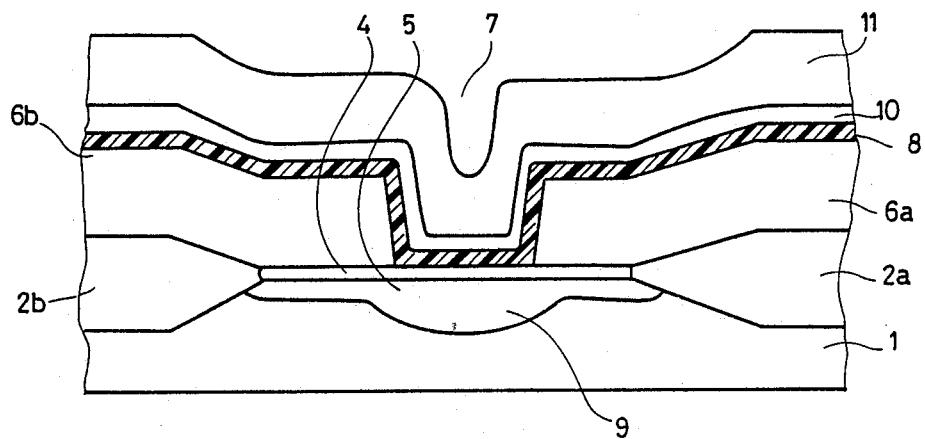

Referring to FIG. 3I, an aluminum alloy film 11 of, e.g., AlSi is formed over the entire surface of the TiN film 10 through a sputtering method or the like.

Description is now made on the function of the semiconductor device manufactured through the steps as shown in FIGS. 3A to 3I.

First, the function of the $TiSi_2$ film 4 formed on the silicon substrate 1 as shown in FIG. 3C is described. When the silicon substrate 1 formed with the Ti film 3 (FIG. 3B) is subjected to heat treatment as hereinabove described, silicide reaction takes place between Ti in the Ti film 3 and Si in the silicon substrate 1, whereby a portion of the Ti film 3 being in contact with the silicon substrate 1 forms the $TiSi_2$ film 4. A Si diffusion step serves as a rate-determining step of the silicide reaction in practice. Therefore, when the heat treatment is performed at a high temperature for a long time, silicide may be formed on the insulating films 2a and 2b to cause shorting between the adjacent element regions. Further, Si may be diffused from the silicon substrate 1 into the Ti films 3a and 3b on the insulating films 2a and 2b to define concavities on the silicon substrate 1. However, such problems can be prevented by optimizing the temperature and time for the heat treatment, to self-alignedly form the $TiSi_2$ film 4 as shown in FIG. 3C. Further, the Ti films 3a and 3b on the insulating films 2a and 2b can be selectively removed by a mixed solution of $H_2O_2$ and $NH_4OH$ without corroding the $TiSi_2$ film 4. Thereafter the impurity diffusion layer 5 is formed through ion implantation etc. as shown in FIG. 3D, and such structure of the $TiSi_2$ film 4 deposited on the impurity diffusion layer 5 enables reduction in sheet resistivity of the impurity diffusion layer 5.

When, for example, the channel length of a MOS transistor reaches the length of a submicron region, the impurity diffusion layer must be reduced injunction depth as hereinabove described in order to prevent a "short channel effect" and retain characteristics of elements at the sacrifice of the sheet resistivity. In an experiment of forming an impurity diffusion layer of 0.15 μm by injecting As into a silicon substrate, the sheet resistivity was about 100 Ω/□.

However, according to the structure of this embodiment depositing the Ti film 3 of, e.g., 50 nm in thickness on the impurity diffusion layer 5, the sheet resistivity is about 2 to 3 Ω/□ although the same junction depth is maintained. Namely, the $TiSi_2$ film 4 contributes to the reduction in sheet resistivity of the impurity diffusion layer 5, thereby to facilitate formation of normal P-N junction.

Description is now made on the function of the $MoSi_2$ film 8 formed entirely over the surfaces of the interlayer insulating films 6a and 6b and the interior of the contact hole 7 as shown in FIG. 3F. Suppose that no such $MoSi_2$ film 8 is provided. When the other impurity diffusion layer 9 is formed with no provision of the $MoSi_2$ film 8 as shown in FIG. 3E, an oxide film is formed on the $TiSi_2$ film 4. When, for example, the impurity diffusion layer 9 is formed through injection of phosphorus (P) and a thermal diffusion method, phosphor glass is formed and a film of silicon oxide or titanium oxide is formed on the $TiSi_2$ film 4 by oxidation thereof upon heat treatment. Such an oxide film must be removed in advance to ensure electric contact with the aluminum alloy film 11 formed in a subsequent step. The oxide film is generally removed by etching through a solution of hydrofluoric acid, whereby the $TiSi_2$ film 4 is inevitably etched by hydrofluoric acid.

According to the present invention, however, the $MoSi_2$ film 8 insoluble to hydrofluoric acid as shown in FIG. 3F is provided in advance to formation of the on the surface of the $MoSi_2$ film 8 can be removed without corroding the $TiSi_2$ film 4.

Due to the heat treatment for forming the impurity diffusion layer 9, metallurgical reaction may take place between the $TiSi_2$ film 4 and the $MoSi_2$ film 8, to form a ternary silicide film. Such formation of the ternary silicide film depends on the thickness of the $TiSi_2$ film 4 and the $MoSi_2$ film 8 and the temperature and time for the heat treatment.

Figure 4A:
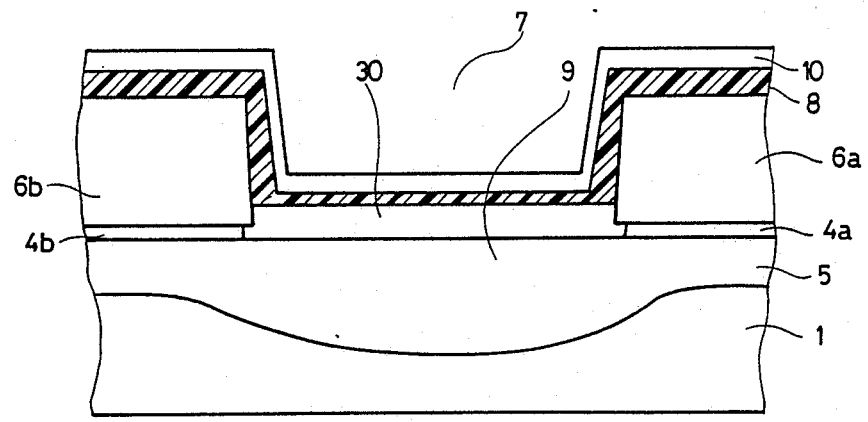
FIGS. 4A to 4D are sectional views showing various states of formation of ternary silicide films in the semiiconductor device according to the embodiment of the present invention.
Figure 4B:
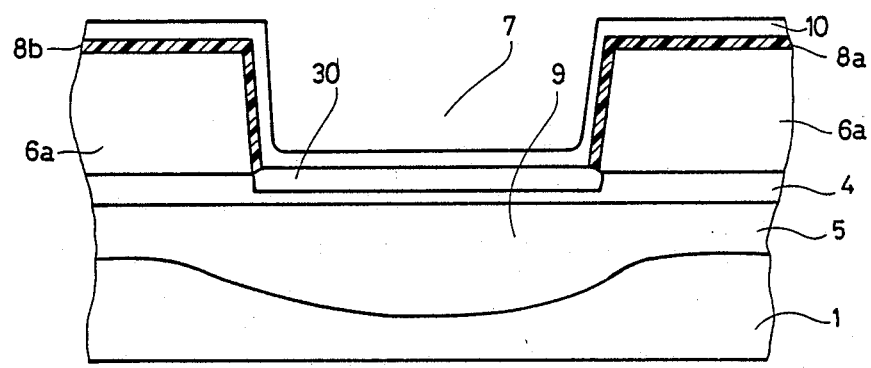
Figure 4C:
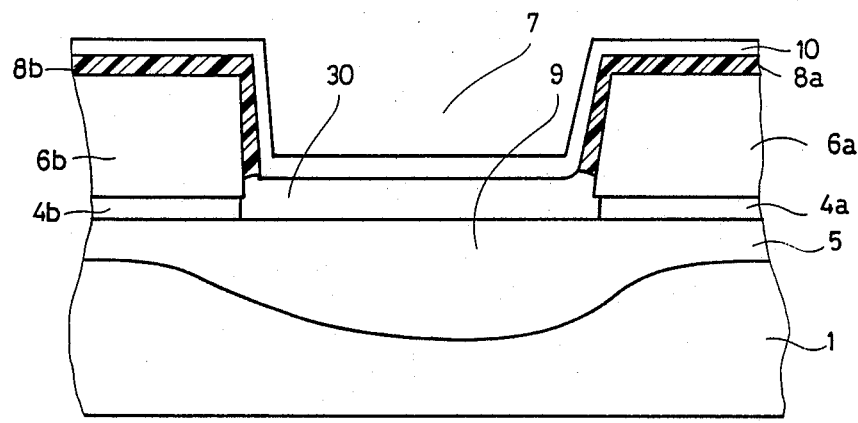
Figure 4D:
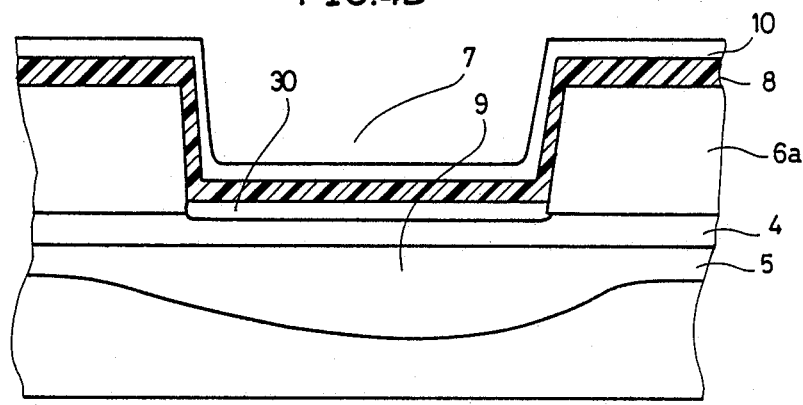

FIGS. 4A to 4D are sectional views respectively showing various states of formation of such ternary silicide films. For example, an originally thin $TiSi_2$ film 4 entirely reacts on an $MoSi_2$ film 8 formed on the same, thereby leaving a film 30 of $Ti_XMo_YSi_Z$ (X, Y, Z: composition ratio) and an unreactive $MoSi_2$ film 8 as shown in FIG. 4A. When an $MoSi_2$ film 8 is originally thin to the contrary, the $MoSi_2$ film 8 entirely reacts on a $TiSi_2$ film 4 formed under the same, thereby leaving a $Ti_XMo_YSi_Z$ film 30 and an unreactive $TiSi_2$ film 4 as shown in FIG. 4B. When heat treatment is performed at a high temperature or for a long time, both of a $TiSi_2$ film 4 and an $MoSi_2$ film 8 are completely alloyed to form a $Ti_XMo_YSi_Z$ film 30 as shown in FIG. 4C. When heat treatment is performed at a low temperature for a short time to the contrary, metallurgical reaction takes place only in an interface portion between a $TiSi_2$ film 4 and an $MoSi_2$ film 8, thereby leaving an unreactive $TiSi_2$ film 4, a $Ti_XMo_YSi_Z$ film 30 and an unreactive $MoSi_2$ film 8 as shown in FIG. 4D.

The said ternary silicide films 30 are sufficient in corrosion resistance against hydrofluoric acid in comparison with the $TiSi_2$ films 4 unless Y=0, and are sufficiently resistant against removal of the aforementioned oxide film through etching.

It has been confirmed by a Rutherford back scattering method that a film of $Ti_XMo_YSi_Z/TiSi_2$ was formed by thermally treating an $MoSi_2$ film of 150 Å and a $TiSi_2$ film of 2000 Å at a temperature of 800° C. for 20 minutes. In this case, X, Y and Z were distributed along the direction of depth and Mo was excessive in the vicinity of the surface while Ti was increased with depth.

Description is now made on the function of the TiN film 10 formed on the entire surface of the $MoSi_2$ film 8 as shown in FIG. 3H. Suppose that no such TiN film 10 is provided. Upon formation of the aluminum alloy film 11 as shown in FIG. 3I, heat treatment is generally performed at a temperature of about 300° to 500° C. for annealing this film or forming a passivation film. If a metal silicide film such as the $MoSi_2$ film 8 is formed directly under the aluminum alloy film 11, the aluminum alloy film 11 reacts on the said metal silicide film due to the said heat treatment to degrade contact resistance, whereby decomposed Al may reach the semiconductor silicon substrate 1 to break the P-N junction in the worst case.

According to the present invention, however, the TiN film 10 is provided on the $MoSi_2$ film 8 as shown in FIGS. 3H and 3I to serve as an excellent barrier for Al diffusion in advance to formation of the aluminum alloy film 11, thereby to prevent thermal reaction between the $MoSi_2$ film 8 and the aluminum alloy film 11.

Reliability in electromigration has become a subject of discussion with reduction in the width of aluminum alloy interconnections following development of high integration, and the aforementined aluminum alloy/TiN structure improves the electromigration characteristic.

The contact hole portion for electrode interconnection is structured in the aforementioned manner, whereby the impurity diffusion layers 5 and 9 of the silicon substrate 1 themselves can be reduced in sheet resistivity while contact resistance between the impurity diffusion layers 5 and 9 and the $TiSi_2$ film 4 is lower than general contact resistance between the impurity diffusion layers 5 and 9 and the aluminum alloy film 11. Further, chemical resistance against hydrofluoric acid etc. is increased and no thermal reaction takes place between the aluminum alloy film 11 and the $MoSi_2$ film 8 formed under the same, while the aluminum alloy film 11 itself has an excellent electromigration characteristic.

Although the Ti film 3 is formed in the aforementioned embodiment, it may be replaced by a tantalum (Ta) film, zirconium (Zr) film or a hafnium (Hf) film, to attain a similar effect to that of the embodiment.

The $MoSi_2$ film 8 in the aforementioned embodiment may be replaced by a tungsten silicide ($WSi_2$) film, to attain a similar effect to that of the embodiment.

Although the $TiSi_2$ film/$MoSi_2$ film, $Mo_XTi_YSi_Z$ film/$MoSi_2$ film, $TiSi_2$ film/$Mo_XTi_YSi_Z$ film, $No_XTi_YSi_Z$ film, $TiSi_2$ film/$Mo_XTi_YSi_Z$ film/$MoSi_2$ film are formed in the aforementioned embodiment, the same may be replaced by $BSi_2$ film/$MoSi_2$ film (B=Ta, Zr or Hf, and so forth), $ASi_2$ film/$WSi_2$ film (A=Ti, Ta, Zr or Hf, and so forth), $Mo_XB_YSi_Z$ film/$MoSi_2$ film, $W_XA_YSi_Z$ film/$WSi_2$ film, $BSi_2$ film/$Mo_XB_YSi_Z$ film, $ASi_2$ film/$W_XA_YSi_Z$ film, $Mo_XB_YSi_Z$ film, $W_XA_YSi_Z$ film, $BSi_2$ film/$Mo_XB_YSi_Z$ film/$MoSi_2$ film or $ASi_2$ film/$W_XA_YSi_Z$ film/$WSi_2$ film, to attain a similar effect to that of the embodiment.

The TiN film 10 in the aforementioned embodiment may be replaced by a TiW film or a TaN film, to attain a similar effect to that of the embodiment.

The AlSi film 11 in the aforementioned embodiment may be replaced by an Al film, an alloy film of AlSi and other metal or an alloy film of Al and other metal, to attain a similar effect to that of the embodiment.

Although the embodiment has been described on the structure of a contact hole portion on impurity diffusion layers, the present invention is also applicable to the structure of a gate electrode interconnection in a MOS element, i.e., the structure of a contact hole portion of a polycrystal silicon film, to attain a similar effect to that of the embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
a semiconductor substrate formed with an impurity diffusion layer as an electrode region;
a metal electrode interconnection film having a contact hole portion selectively formed over one part of said impurity diffusion layer, said one part having a greater depth as compared with a remaining part of said impurity diffusion layer;
a refractory metal silicide film formed at least on said one part of the impurity diffusion layer, said refractory metal silicide film having relatively low electrical resistance and sufficient resistance to corrosion by hydrofluoric acid, said refractory metal silicide film including an upper silicide layer of MoSi$_2$ and a lower silicide layer of Mo, Ti and Si; and
a TiN barrier film formed between said refractory metal silicide film and said metal electrode interconnection film for coupling said refractory metal silicide film with said metal electrode interconnection film.

2. A semiconductor device comprising:
a semiconductor substrate formed with an impurity diffusion layer as an electrode region;
a metal electrode interconnection film having a contact hole portion selectively formed over one part of said impurity diffusion layer, said one part having a greater depth as compared with a remaining part of said impurity diffusion layer;
a refractory metal silicide film formed at least on said one part of the impurity diffusion layer, said refractory metal silicide film having relatively low electrical resistance and sufficient resistance to corrosion by hydrofluoric acid, said refractory metal silicide film including an upper silicide layer of MoSi$_2$, a middle silicide layer of Mo, Ti and Si, and a lower silicide layer of TiSi$_2$; and
a TiN barrier film formed between said refractory metal silicide film and said metal electrode interconnection film for coupling said refractory metal silicide film with said metal electrode interconnection film.

3. A semiconductor device in accordance with claim 1, wherein the refractory metal silicide film is formed on the entire impurity diffusion layer.

4. A semiconductor device in accordance with claim 2, wherein the refractory metal silicide film is formed on the entire impurity diffusion layer.

5. A semiconductor device comprising:
a semiconductor substrate formed with an impurity diffusion layer as an electrode region;
a metal electrode interconnection film having a contact hole portion selectively formed over one part of said impurity diffusion layer, said one part having a greater depth as compared with a remaining part of said impurity diffusion layer;
a refractory metal silicide film formed at least on said one part of the impurity diffusion layer, said refractory metal silicide film having relatively low electrical resistance and sufficient resistance to corrosion by hydrofluoric acid, said refractory metal silicide film including an upper silicide layer of WSi$_2$ and a lower silicide layer of W, Ti and Si; and
a TiN barrier film formed between said refractory metal silicide film and said metal electrode interconnection film for coupling said refractory metal silicide film with said metal electrode interconnection film.

6. A semiconductor device comprising:
a semiconductor substrate formed with an impurity diffusion layer as an electrode region;
a metal electrode interconnection film having a contact hole portion selectively formed over one part of said impurity diffusion layer, said one part having a greater depth as compared with a remaining part of said impurity diffusion layer;
a refractory metal silicide film formed at least on said one part of the impurity diffusion layer, said refractory metal silicide film having relatively low electrical resistance and sufficient resistance to corrosion by hydrofluoric acid, said refractory metal silicide film including an upper silicide layer of WSi$_2$, a middle silicide layer of W, Ti and Si, and a lower silicide layer of TiSi$_2$; and
a TiN barrier film formed between said refractory metal silicide film and said metal electrode interconnection film for coupling said refractory metal silicide film with said metal electrode interconnection film.

7. A semiconductor device in accordance with claim 5, wherein the refractory metal silicide film is formed on the entire impurity diffusion layer.

8. A semiconductor device in accordance with claim 6, wherein the refractory metal silicide film is formed on the entire impurity diffusion layer.

9. A semiconductor device comprising:
a semiconductor substrate formed with an impurity diffusion layer as an electrode region;
a metal electrode interconnection film having a contact hole portion selectively formed over one part of said impurity diffusion layer, said one part having a greater depth as compared with a remaining part of said impurity diffusion layer;
a refractory metal silicide film formed on the impurity diffusion layer, said refractory metal silicide film having relatively low electrical resistance and sufficient resistance to corrosion by hydrofluoric acid, said refractory metal silicide film comprising a first refractory metal silicide of low electrical resistance formed of Mo, Ti and Si on the entire impurity diffusion layer and a second refractory metal silicide having resistance to corrosion by hydrofluoric acid formed of MoSi$_2$ on said one part of the impurity diffusion layer in a self-aligning manner; and
a barrier film formed of TiN between said refractory metal silicide film and said metal electrode interconnection film for coupling said refractory metal silicide film with said metal electrode interconnection film.

10. A semiconductor device comprising:
a semiconductor substrate formed with an impurity diffusion layer as an electrode region;
a metal electrode interconnection film having a contact hole portion selectively formed over one part of said impurity diffusion layer, said one part having a greater depth as compared with a remaining part of said impurity diffusion layer;
a refractory metal silicide film formed on the impurity diffusion layer, said refractory metal silicide film having relatively low electrical resistance and sufficient resistance to corrosion by hydrofluoric acid, said refractory metal silicide film comprising a first refractory metal silicide of low electrical resistance formed of W, Ti and Si on the entire impurity diffusion layer and a second refractory metal silicide having resistance to corrosion by hydrofluoric acid formed of $WSi_2$ on said one part of the impurity diffusion layer in a self-aligning manner; and
a barrier film formed of TiN between said refractory metal silicide film and said metal electrode interconnection film for coupling said refractory metal silicide film with said metal electrode interconnection film.

* * * * *